# United States Patent [19]

Jain et al.

[11] Patent Number: 5,262,491
[45] Date of Patent: Nov. 16, 1993

[54] HIGH PERFORMANCE CURABLE PPO/MONOMERIC EPOXY COMPOSITIONS WITH TIN METAL SALT COMPATIBILIZING AGENT

[75] Inventors: Rakesh Jain, Coshocton; James E. Tracy, Glenford; Kalyan Ghosh, Columbus, all of Ohio

[73] Assignee: General Electric Company, Coshocton, Ohio

[21] Appl. No.: 677,229

[22] Filed: Mar. 29, 1991

[51] Int. Cl.$^5$ ............... C08L 63/02; C08L 71/12
[52] U.S. Cl. ........................ 525/396; 523/442; 523/459
[58] Field of Search ............... 525/396; 523/442, 459

[56] References Cited

U.S. PATENT DOCUMENTS 4,853,423  8/1989  Walles et al. ............ 523/428
5,043,367  8/1991  Hallgren et al. .......... 525/396
5,073,605  12/1991 Hallgren et al. .......... 525/396

FOREIGN PATENT DOCUMENTS 0436212  7/1991  European Pat. Off. ............ 525/396

OTHER PUBLICATIONS

Lee, Henry and Kris Neville, "Handbook of Epoxy Resins". McGraw-Hill, New York (1967) pp. 11-11, 11-12.

Primary Examiner—James J. Seidleck
Assistant Examiner—thomas Hamilton, III

[57] ABSTRACT

Disclosed are curable compositions based on a combination of polyphenylene oxide, monomeric epoxy resin, a compatibilizing metal salt of tin, and suitable curing agents. The monomeric epoxy resin comprises a polyepoxide composition comprising at least one bisphenol polyglycidyl ether having an average of at most one aliphatic hydroxy group per molecule. The composition may be used in the preparation of laminates useful as printed circuit boards.

19 Claims, No Drawings

HIGH PERFORMANCE CURABLE PPO/MONOMERIC EPOXY COMPOSITIONS WITH TIN METAL SALT COMPATIBILIZING AGENT

BACKGROUND OF THE INVENTION

The present invention relates to resinous compositions useful as dielectrics and more particularly to polyphenylene ether-polyepoxide compositions suitable for fabrication into printed circuit boards.

A number of polyphenylene ether-polyepoxide compositions have favorable dielectric properties, and supposedly being useful in circuit board manufacture, are known. However, for the most part these have not attained wide commercial use because of deficiencies in one or more properties. Thus, while the polyphenylene ethers are excellent dielectrics and the properties of combinations thereof with polyepoxides are favorable in this respect, they lack solvent resistance which is required in order for the circuit board to survive cleaning. Other deficiencies are found in areas such as flammability, solderability, and resistance to high temperatures.

In addition to excellent dielectric properties, resinous compositions to be used for printed circuit board manufacture should be highly flame-retardant. A V-1 rating, as determined by Underwriters Laboratories test procedure UL-94, is universally required with V-0 usually being necessary. The V-0 rating requires a flame-out time (FOT) of not more than 10 seconds in any trial and a cumulative FOT of not more than 50 seconds for five samples. As a practical matter, a maximum cumulative FOT of 35 seconds often is mandated by purchasers.

The fabricated board should not lose substantial weight and its surface should not be appreciably marred by contact with methylene chloride, a solvent commonly used for cleaning. Since conductive connections with the printed circuit typically are made by soldering, the board must be solder-resistant as evidenced by the lowest possible percent increase in thickness (Z-axis expansion) when exposed to liquid solder at 288° C. In addition to all these properties of the cured material, a relatively short curing time is highly desirable.

In Japanese Kokai 58/69052, combinations of polyphenylene ethers with various types of polyepoxides are disclosed. The latter include epoxy novolac resins and polyglycidyl ethers of such compounds as bisphenol A and 2,2-bis(3,5-dibromo-4-hydroxyphenyl) propane, commonly referred to as tetrabromobisphenol A. Curing of these compositions is achieved by contact with various known curing agents, including amines. The cured compositions, however, have been found to be seriously deficient in solvent resistance and, in certain cases, in solderability.

Copending, commonly-assigned application Ser. No. 288,214, filed Dec. 22, 1988, discloses curable polyphenylene ether-polyepoxide compositions where the polyepoxide composition is based on a monomeric bisphenol polyglycidyl ether having an average of at most one aliphatic hydroxyl group per molecule and containing about 10%-30% bromine as aryl substituents. This monomeric system exhibits improved processability in the treating operation, but does not yet have cure speed as fast as some manufacturers desire. The high content of brominated monomeric polyepoxide contributes to the cost of such composition also. Finally, Z-direction thermal expansion coefficients of laminates based on this monomeric system may be higher than is acceptable in some uses of laminates made therewith. Accordingly, room for improvement with respect to these factors exists.

In addition, curable compositions suitable for bonding sheet fabrication are needed. Bonding sheets are employed when a multi-layer structure is desired, involving etching of numerous printed circuits followed by their lamination into a single unit. For this purpose, a fiber-reinforced resinous bonding sheet is employed to separate the etched copper circuity on two successive circuit boards, with the desired connections being made through the bonding sheet.

The bonding sheet composition must generally have a substantially higher flow rate when melted under low pressure than a composition employed in circuit board manufacture. It must also have a relatively high resin loading, since the resin must completely fill the voids created during the etching of circuits in the printed circuit boards. Extended cure time also is necessary, in order that the required flow may be achieved before curing time is initiated. The formulation must be compatible with the base material in the circuit board.

BROAD STATEMENT OF THE INVENTION

The present invention is directed to a curable composition containing at least about 5% chemically combined bromine. When used to impregnate suitable fibrous reinforcing materials such as glass cloth fiber, such composition furnishes workable prepregs. For present purposes, "prepreg" means a curable article comprising a substrate impregnated with an uncured or partially cured resinous material. The curable composition of the present invention is readily soluble in organic solvents, facilitating impregnation. The cured materials prepared therefrom are solder resistant, solvent resistant, can be made flame retardant, and have excellent dielectric properties and dimensional stability at high temperature. Therefore, the curable composition when cured excels in the manufacture of laminates and bonding sheets for printed circuit boards.

The curable composition of the present invention comprises:

(a) between about 20% and 55% by weight of (a) and (b) of at least one polyphenylene ether or polyphenylene oxide (PPO);

(b) between about 20% and 60% by weight of (a) and (b) of a polyepoxide composition comprising at least one bisphenol polyglycidyl ether having an average of at most one aliphatic hydroxy group per molecule, said composition containing about 10% to 30% bromine as aryl substituents;

(c) a metal salt of tin in an amount effective for compatibilizing (a) and (b);

(d) a catalytically-effective amount of an epoxy resin catalyst; and (e) an inert solvent.

The foregoing percentages all are weight percentages. Prepregs made with the inventive curable composition form another aspect of the present invention.

Advantages of the present invention include a PPO/epoxy resin system with good processability in the treating operation, high prepreg resin flow, and lower laminate z-direction thermal expansion coefficients. Further advantages include the retention of methylene chloride resistance, molten solder resistance, and UL94 V-0 flammability characteristics. Another advantage is a system that exhibits one phase behavior characterized by a single glass transition temperature. Yet a further advantage is a system that achieves the foregoing desired characteristics at low cure times. These and other advantages will be readily apparent to those skilled in the art based upon the disclosure contained herein.

DETAILED DESCRIPTION OF THE INVENTION

The polyphenylene ethers useful as component A in the compositions of this invention comprise a plurality of structural units having the formula:

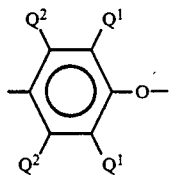

(I)

In each of said units independently, each $Q^1$ is independently halogen, primary or secondary lower alkyl (i.e., alkyl containing up to 7 carbon atoms, phenyl, haloalkyl, aminoalkyl, hydroxycarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydroxycarbonoxy as defined for $Q^1$. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-, 3-, or 4-methylpentyl and the corresponding heptyl groups. Examples of secondary lower alkyl groups are isopropyl, sec-butyl, and 3-pentyl. Preferably, any alkyl radicals are straight chain rather than branched. Most often, each $Q^1$ is alkyl or phenyl, especially $C_{1-4}$alkyl, and each $Q^2$ is hydrogen.

Both homopolymer and copolymer polyphenylene ethers are included. Suitable homopolymers are those containing, for example, 2,6-dimethyl-1,4-phenylene ether units. Suitable copolymers include random copolymers containing such units in combination with (for example) 2,3,6-trimethyl-1,4-phenylene ether units. Many suitable random copolymers, as well as homopolymers, are disclosed in the patent literature.

Also included are polyphenylene ethers containing moieties which modify properties such as molecular weight, melt viscosity, and/or impact strength. Such polymers are described in the patent literature and may be prepared by grafting onto the polyphenylene ether in known manner such non-hydroxy-containing vinyl monomers as acrylonitrile and vinylaromatic compounds (e.g., styrene), or such non-hydroxy-containing polymers as polystyrenes and elastomers. The product typically contains both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles, and formals.

For the purposes of this invention, the polyphenylene ether has a number average molecular weight within the range of about 3,000–40,000, preferably at least about 12,000 and most preferably at least about 15,000, and a weight average molecular weight within the range of about 20,000–80,000 as determined by gel permeation chromatography. Its intrinsic viscosity is most often in the range of about 0.35–0.6 dl./g., as measured in chloroform at 25° C.

The polyphenylene ethers are typically prepared by the known oxidative coupling of at least one corresponding monohydroxyaromatic compound. Particularly useful and readily available monohydroxyaromatic compounds are 2,6-xylenol (wherein $Q^1$ and one $Q^2$ are methyl and the other $Q^2$ is hydrogen), whereupon the polymer may be characterized as a poly (2,6-dimethyl-1,4-phenylene ether), and 2,3,6-trimethylphenol (wherein each $Q^1$ and one $Q^2$ are methyl and the other $Q^2$ is hydrogen).

Particularly useful polyphenylene ethers for the purposes of this invention are those which comprise molecules having aminoalkyl-substituted end groups, as described in numerous patents and publications. Such molecules frequently constitute a substantial proportion of the polyphenylene ether, typically as much as about 90% by weight. Polymers of this type may be obtained by incorporating an appropriate primary or secondary monoamine as one of the constituents of the oxidative coupling reaction mixture.

The PPO component, optionally, can be "equilibrated" by pre-reaction with benzoyl peroxide (or the like) in the presence of bisphenol A (or the like), thereby reducing the molecular size of the PPO chains via a cleavage reaction. The use of equilibrated PPO results in a marked reduction in varnish mix viscosity, thus producing better fabric saturation and higher flow prepreg in the treating operation.

It will be apparent to those skilled in the art from the foregoing that the polyphenylene ethers contemplated for use in the present invention include all those presently known, irrespective of variations in structural units or ancillary chemical features.

Component (b) is a polyepoxide composition comprising at least one bisphenol polyglycidyl ether. It usually comprises a mixture of such ethers, part of the components of said mixture being halogen-free and the balance thereof containing bromine as aryl substituents. The total amount of bromine therein is about 10%–30% by weight.

Compounds of this type are prepared conventionally by the reaction of bisphenols with epichlorohydrin. (By "bisphenol" as used herein is meant a compound containing two hydroxyphenyl groups attached to an aliphatic or cycloaliphatic moiety, which may also contain aromatic substituents.) Said compounds may be represented by the formula:

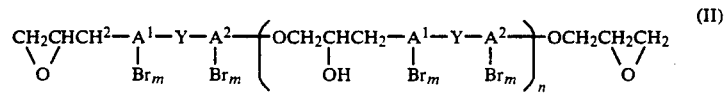

(II)

wherein m is 0–4, n has an average value up to 1, each of $A^1$ and $A^2$ is a monocyclic divalent aromatic radical and Y is a bridging radical in which one or two atoms separate $A^1$ from $A^2$. The $O-A^1$ and $A^2-O$ bonds in formula II are usually the meta or para positions of $A^1$ and $A^2$ in relation to Y.

In formula II, the $A^1$ and $A^2$ values may be unsubstituted phenylene or substituted derivatives thereof, illustrative substituents (one or more) being alkyl, nitro, alkoxy and the like. Unsubstituted phenylene radicals are preferred. Each of $A^1$ and $A^2$ may, for example, be o- or m-phenylene and the other p-phenylene, but both are preferably p-phenylene.

The bridging radical, Y, is one in which one or two atoms, preferably one, separate $A^1$ and $A^2$. It is most often a hydrocarbon radical and particularly a saturated radical such as methylene, cyclohexylmethylene, ethylene, isopropylidene, neopentylidene, cyclohexylidene or cyclopentadecylidene, especially a gem-alkylene (alkylidene) radical and most preferably isopropylidene. Also included, however are radicals which contain atoms other than carbon and hydrogen; for example, carbonyl, oxy, thio, sulfoxy, and sulfone.

In most instances, component (b) comprises at least two bisphenol polyglycidyl ethers, one being brominated (m is 1–4, preferably 2) and the other bromine-free (m is 0). The proportions thereof are based on the required bromine content for component (b) of about 10%–30%. The preferred materials are commercially available from Shell Chemical Co., and similar products prepared from epichlorohydrin and tetrabromobisphenol A. The principal purpose of the brominated compounds is to provide flame retardancy.

Component (c) is a salt of tin that is used in an amount effective for compatibilizing (a) and (b). Unexpectedly, tin salts exhibit phase compatibilization in the inventive modified epoxy resin system as evidenced by behavior characterized by a single glass transition temperature. Additionally, when used with appropriate curing agents and cure accelerators, enhanced cure characteristics of the resin system are realized. The effective amount of the tin metal salt ranges typically from about 0.05 to 1.0% by weight of components (a) and (b). Conventional tin metal salts include, for example, stannous octoate, di-alkyl tin dicarboxylates such as dibutyl tin dicarboxylates (e.g. dibutyl tin dioctoate), tin mercaptides (e.g. dibutyl tin dilauryl mercaptide), stannous acetate, stannic oxide, stannous citrate, stannous oxylate, stannous chloride, stannic chloride, tetra-phenyl tin, tetra-butyl tin, tri-n-butyl tin acetate, di-n-butyl tin dilaurate, dimethyl tin dichloride, and the like and even mixtures thereof. It should be understood that the use of tin metal salts obviated the necessity for inclusion of epoxidized novolacs and upstaged epoxy resins as proposed in the art and even application Ser. No. 288,214.

Component (d) is any catalyst effective as a curing agent for epoxy resins, e.g. imidazoles and arylene polyamines. Particularly useful imidazoles are imidazole, 1-methylimidazole, 1,2-dimethylimidazole, 2-methylimidazole, 2-heptadecylimidazole, 2-ethyl-4-methylimidazole, 2-undecylimidazole, and 1-(2-cyanoethyl)-2-phenylimidazole. Representative useful arylene polyamines include, for example, diethyltoluenediamine, tris(dimethylaminomethyl)phenol, and 3-phenyl-1,1-dimethyl urea. Commercially available imidazole-arylene polyamine mixtures can be used; the especially preferred mixtures contain arylene polyamines with a high degree of alkyl substitution on the aromatic ring, typically at least three such substituents. The diethylmethyl-substituted m- and p-phenylenediamines are generally the most preferred polyamines.

Unexpectedly, silane coupling agents added to improve wetting out of the fabric reinforcement displayed effective catalytic behavior in the curable formulation. Silanes evaluated include 3-(2-aminoethyl)-aminopropyl trimethoxysilane, gamma-aminopropyl triethoxysilane, and glycidoxypropyl trimethoxysilane. The amine-containing silanes proved more effective. Silanes can be used as co-catalysts or can be the primary catalyst.

The amount of component (d) is a catalytically effective amount to achieve curing, preferably rapidly after solvent removal. Most often, it is at least 4.5 and preferably at least 10 milliequivalents of basic nitrogen per 100 parts of total curable composition, including any basic nitrogen present in the polyphenylene ether (mostly as aminoalkyl-substituted end groups). Thus, when a polyphenylene ether essentially free from basic nitrogen is employed, the proportion of component (d) must be increased. (For the purpose of this invention, the equivalent weight of an imidazole is its molecular weight and that of a diamine is half its molecular weight.)

Co-catalysts and activators desirably also are used for achieving advantageous cure rates of the inventive curable composition. Salts of diketones in which one carbon atom separates the carbonyl groups, especially acetylacetonates, and salts of fatty acids, especially stearates and octoates, are examples of suitable forms of zinc, magnesium, or aluminum for this purpose. Specific examples include zinc acetylacetonate, zinc stearate, magnesium stearate, aluminum acetylacetonate, zinc octoate, zinc neodecanoate, and zinc naphthenate. Additional secondary catalysts include, for example, maleic anhydride and $BF_3$-ethylamine complex.

Under certain conditions, acetylacetonates such as zinc acetylacetonate can form hydrates which readily lose acetylacetone and become insoluble in the organic systems used for laminate preparation. Therefore, it may be necessary to take steps to maintain the zinc or aluminum in stable dispersion. One means for doing this is to subject the composition to continuous agitation; however, this is generally not practical. A better method is to form an alcoholate of the acetylacetonate, as by reaction with methanol. The alcoholate loses alcohol rather than acetylacetonate under similar conditions, remaining in solution or homogeneous suspension.

Another method for maximizing homogeneity is to employ a fatty acid salt. Still another method is to employ a titanium compound as a compatibilizer, as disclosed hereinafter.

Co-catalysts are employed in a cocatalytically effective amount, and generally also serve to improve solvent resistance and flame retardancy. About 0.1%–1.5% of zinc, magnesium, or aluminum, based on total curable composition, is usually present.

Among the other materials which may be present are inert, particulate fillers such as talc, clay, mica, silica, alumina, and calcium carbonate. In addition, the bromine content of the curable composition may be supplied in part by materials such as alkyl tetrabromophthalates and/or epichlorohydrin reaction products with mixtures of bisphenol A and tetrbromobisphenol A. The alkyl tetrabromophthalates also serve as plasticizers and flow improvers. Fabric wettability enhancers (e.g. wetting agents and coupling agents) and polar liquids such as n-butyl alcohol, methyl ethyl ketone, polysiloxanes, and tetrahydrofuran, may be advantageous under certain conditions. Such materials as antioxidants, thermal and ultraviolet stabilizers, lubricants, antistatic agents, dyes, and pigments may also be present.

The curable compositions of the invention are dissolved in an effective amount of an inert organic solvent, typically to a solute content of about 30%-60% by weight. The identity of the solvent is not critical, provided it may be removed by suitable means such as evaporation. Aromatic hydrocarbons, especially toluene, are preferred. The order of blending and dissolution is also not critical; however, in order to avoid premature curing, catalyst and hardener components generally should not be brought initially into contact with polyphenylene ether and polyepoxides at a temperature above about 60° C. Proportions of components and bromine herein do not include solvent.

The broad ranges of proportions and the preferred proportions of bromine and the various components in the curable compositions of the invention based on total curable composition (excluding solvent), are:

|  | Broad | Preferred |
|---|---|---|
| Bromine | At least about 5% | About 5-20% |
| Component (a) | About 20-55% | About 40-50% |
| Component (b) | About 20-60% | About 45-55% |
| Component (c) | About 0.05-1.0% | About 0.1-0.5% |
| Component (d) | At least 4.5 meq. basic N (total) | About 15-30 meq. basic N (total) |
| Component (f) | About 0.1-1.5% Zn or Al | About 0.5-1.3% Zn or Al |

An important feature of the invention is the fact that flame retardancy synergists, such as antimony pentoxide, are generally not necessary. However, they may be incorporated when appropriate.

When antimony pentoxide is employed, it must be maintained in stable dispersion. This may be done by agitation and/or combination with a suitable dispersing agent, of which many are known in the art. The proportion of antimony pentoxide is usually up to about 4 parts per 100 parts of components (a)-(b).

One preferred dispersing agent is a polymer which is compatible with the resinous constituents of the curable composition but is substantially non-reactive under the conditions employed, typically a polyester. More powerful dispersing agents, such as amines, may be required when component (f) is a fatty acid salt, since such salts may otherwise form insoluble complexes with antimony pentoxide.

A material whose presence in minor amount may improve the solvent resistance and compatibility of the curable composition, and is therefore preferred, is at least one aliphatic tris(dialkylphosphato)titanate. Suitable phosphatotitanates are known in the art and commercially available. They may be represented by the formula:

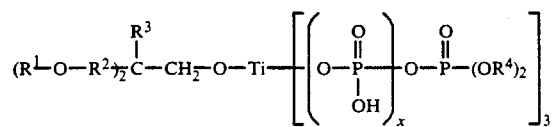

wherein $R^1$ is $C_{2-6}$ primary or secondary alkyl or alkenyl and preferably alkenyl, $R^2$ is $C_{1-3}$ alkylene and preferably methylene, $R^3$ is $C_{1-5}$ primary or secondary alkyl and x is from 0 to about 3 and is preferably 0 or 1. Most preferably, $R^1$ is alkyl, $R^3$ is ethyl, $R^4$ is octyl and x is 0. The phosphatotitanate is most often present in the amount of about 0.1-1.0 part by weight per 100 parts of the resinous composition.

The present invention includes all compositions which comprise the above-described constituents, including those containing other unspecified ingredients. However, the compositions which are often preferred comprise components (a)-(e); that is, said components are the only ones which materially affect the basic and novel characteristics of the compositions.

Another aspect of the invention is prepregs comprising a fibrous substrate (woven or non-woven) such as glass, quartz, polyester, polyamide, polypropylene, cellulose, nylon or acrylic fibers, preferably glass, impregnated with the curable composition and obtained upon removal of the solvent therefrom by evaporation or the like. Such prepregs may be cured by application of heat and pressure. The resulting cured articles are other aspects of the invention.

Typically, 2- to 20-ply laminates are compression molded at temperatures in the range of about 200°-250° C. and under pressures on the order of 20-60 kg./cm². Laminates clad with a conductive metal such as copper, useful for printed circuit board production, may be so prepared and cured by art-recognized methods. As previously mentioned, printed circuit board blanks comprising said laminates are characterized by excellent dielectric properties, solderability, flame retardancy and resistance to high temperature conditions and solvents. The metal cladding may then be conventionally patterned.

The preparation of the curable compositions, cured compositions and laminates of this invention is illustrated by the following examples. All parts and percentages are by weight unless otherwise indicated.

EXAMPLE

The following ingredients were employed in formulating curable compositions in accordance with the present invention:

| Ingredient | Chemical/Family | Vendor |
|---|---|---|
| DER 542 | Diglycidyl ether of tetrabromobisphenol-A | Dow Chemical |
| EPON 828 | Diglycidyl ether of bisphenol A | Shell Chemical |
| TBBPA | Tetrabromobisphenol A | Great Lakes |
| PPO | Polyphenylene Oxide | General Electric |
| BPO | Benzoyl Peroxide | Pennwalt |
| CATACHEK 860 | Stannous Octoate | Ferro Corp. |
| THERMCHEK 705 | Zinc Octoate | Ferro Corp. |
| ADDITIVE 57 | Polysiloxanes | Dow-Corning |
| A 1100 | gamma-Aminopropyl triethoxysilane | Union Carbide |
| CABOSIL M-5 | Amorphous Silicon Dioxide | Cabot Corp. |

Run 901031 utilized an appropriate reaction vessel equipped with efficient stirring and a steam-heated jacket and in which polyphenylene oxide (PPO, 2365 g) was equilibrated with tetrabromobisphenol A (176 g) and 78% benzoyl peroxide (63.5 g) in the presence of toluene (2021 g), 30% DER 542 epoxy (4950 g), and EPON 828 epoxy (880 g) at 95° C. for 90 minutes. After the equilibration reaction was complete, free tetrabromobisphenol A (110 g) was added at 95° C. and the resin mix held for 15 minutes at 95° C. Heating was discontinued and resin mixture was allowed to cool towards 60° C. as Catachek 860 stannous octoate (8.25 g), T-705 zinc octoate (368.5 g), Additive 57 (2.8 g), and A 1100 (55 g) were added, respectively. The resin mixture was held under stirring for 15 minutes and then applied to Style 7628 fiberglass cloth in a laboratory treater. The resulting prepreg was hot-pressed into four-ply copper-clad laminates on a hydraulic press at 600 psi and 240° C. platen temperature at the cure times which will be tabulated below.

Run 901102 was prepared in a similar manner with the following changes. The PPO (2767.2 g) was equilibrated with tetrabromobisphenol A (226.9 g), and 78% benzoyl peroxide (145.4 g) in the presence of toluene (1261.8 g), 30% DER 542 epoxy (6187.5 g), and EPON 828 epoxy (1100 g) for 90 minutes at 90° C. After the equilibration reaction was complete, free tetrabromobisphenol A (130.6 g) was added and the resin mixture was held under stirring for 15 minutes at 95° C. Heating was discontinued and the resin mix was allow to cool towards 60° C. as Catachek 860 stannous octoate (10.3 g), T-705 zinc octoate (460.6 g), Additive 57 (3.4 g), A 1100 (68.8 g), and Cabosil M-5 (137.5 g) were

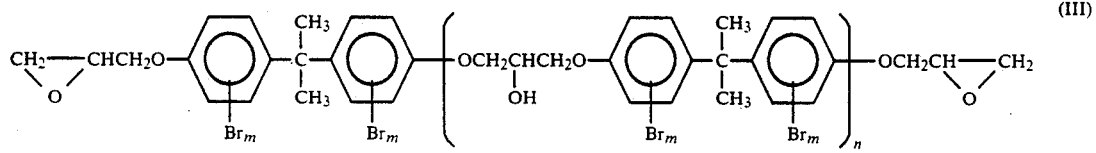

(III)

added, respectively. The treating and pressing conditions were the same as above at the cure times tabulated below.

TABLE 1

| | Run No. 901031 | | | |
|---|---|---|---|---|
| Cure Times | 10' | 6' | 3' | 2' |
| Property | | | | |
| Tg(DMA:E" (°C.) | 193 | 192 | 191 | 192 |
| tan delta (°C.) | 204 | 203 | 204 | 201 |
| Solvent Resistance | Excellent | Excellent | Excellent | Excellent |
| Solder Float Test | 300+ | 300+ | 300+ | 291+ |
| (Seconds to Blister at 550° F.) | | | | |
| Peel Strength (lb/in) | 12.4 | 11.8 | 11.8 | 11.4 |

TABLE 2

| | Run No. 901102 | | |
|---|---|---|---|
| Cure Times | 10' | 5' | 3' |
| Property | | | |
| Tg(DMA:E" (°C.) | 181 | 182 | 179 |
| tan delta (°C.) | 196 | 191 | 196 |
| Solvent Resistance | Excellent | Excellent | Excellent |
| Solder Float Test | 300+ | 300+ | 300+ |
| (Seconds to Blister at 550° F.) | | | |
| Peel Strength (lb/in) | 11.0 | 10.8 | 11.0 |

It is readily apparent from the data exhibited in Tables 1 and 2 that the inventive system exhibits a one-phase behavior characterized by a single glass transition temperature. This enhanced compatibility of the PPO and epoxy phases is seen to reflect itself in the better solvent resistance for the system.

Tables 1 and 2 illustrate the key performance properties wherein it is readily apparent that the monomeric system is cured in three minutes while retaining advantageous solvent resistance and thermal stability characteristics.

We claim:

1. A curable composition containing at least about 5% chemically combined bromine and comprising the following components:
   (a) between about 20% and 55% by weight of (a) and (b) of at least one polyphenylene ether (PPO);
   (b) between about 20% and 60% by weight of (a) and (b) of a polyepoxide composition comprising at least one bisphenol polyglycidyl ether having an average of at most one aliphatic hydroxy group per molecule, said composition containing about 10% to 30% bromine as aryl substituents;
   (c) a metal salt of tin in an amount effective for compatibilizing (a) and (b);
   (d) a catalytically effective amount of an epoxy resin catalyst selected from the group consisting of imidazoles, arylene polyamines, silanes, and mixtures thereof; and
   (e) an inert solvent.

2. The composition of claim 1 wherein (b) comprises compounds having the formula:

wherein m is 0-4 and n has an average value of up to 1.

3. The composition of claim 2 wherein n is 0 and said polyphenylene ether comprises poly(2,6-dimethyl-1,4-phenylene ether) having a number average molecular weight within the range of about 3,000-40,000.

4. The composition of claim 1 wherein said solvent (e) comprises toluene.

5. The composition of claim 1 wherein said catalyst (d) is selected from the group consisting of an imidazole, an arylene polyamine, a silane, and mixtures thereof.

6. The composition of claim 5 wherein said catalyst is selected from the group consisting of imidazole, 1-methylimidazole, 1,2-dimethylimidazole, 2-methylimidazole, 2-heptadecylimidazole, 2-ethyl-4-methylimidazole, 2-undecylimidazole, 1-2(-cyanoethyl)-2-phenylimidazole, diethyl toluene diamine, tris(-dimethylaminomethyl)phenol, 3-phenyl-1,1-dimethylurea, 3-(2-aminoethyl)-aminopropyl trimethoxysilane, gammaaminopropyltriethoxysilane, glycidoxypropyltrimethoxysilane, and mixtures thereof.

7. The composition of claim 1 additionally comprising (f) a cocatalytically effective amount of one or more of zinc, magnesium, or aluminum in the form of a salt which is soluble or stably dispersible in said curable composition, maleic anhydride, and BF$_3$-ethylamine complex.

8. The composition of claim 7 wherein component (f) is selected from the group of zinc acetylacetonate, zinc stearate, zinc octoate, magnesium stearate, aluminum acetylacetonate, zinc neodecanate, zinc naphthenate, and mixtures thereof.

9. The composition of claim 1 which additionally comprises (g) at least one aliphatic tris(dialkylphosphato)titanate of the formula:

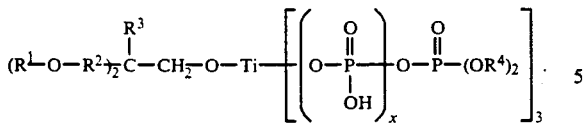

10. The composition of claim 1 which additionally comprises(h) antimony pentoxide stably dispersed therein in an amount of up to 4 weight parts per 100 weight parts of said composition.

11. The composition of claim 1 wherein (1) is comprised of a plurality of structural units having the formula:

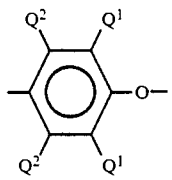

where, each $Q^1$ independently is halogen, a primary or secondary lower alkyl, phenyl, haloalkyl, aminoalkyl, hydroxycarbonoxy, or halohydroxycarbonoxy wherein at least two carbon atoms separate the halogen and oxygen atoms; and each $Q^2$ independently is hydrogen, halogen, a primary or secondary lower alkyl, phenyl, haloalkyl, hydroxycarbonoxy, or halohydroxycarbonoxy as defined for $Q^1$.

12. The composition of claim 1 wherein said metal salt of tin (c) is effective in an amount ranging from between about 0.05 and 1.0% by weight of (a) and (b).

13. The composition of claim 1 wherein said metal salt of tin (c) is selected from the group consisting of stannous octoate, di-alkyl tin dicarboxylates, tin mercaptides, stannous acetate, stannic oxide, stannous citrate, stannous oxylate, stannous chloride, stannic chloride, tetra-phenyl tin, tetra-butyl tin, tri-n-butyl tin acetate, di-n-butyl tin dilaurate, dimethyl tin dichloride, and mixtures thereof.

14. A curable composition containing at least about 5% chemically combined bromine and comprising the following components:
(a) between about 20% and 55% of at least one polyphenylene ether (PPO);
(b) between about 20% and 60% of a polyepoxide composition comprising at least one bisphenol polyglycidyl ether having an average of at most one aliphatic hydroxy group per molecule, said composition containing about 10% to 30% bromine as aryl substituents;
(c) a metal salt of tin in an amount effective for compatibilizing (a) and (b);
(d) a catalytically effective amount of an epoxy resin catalyst selected from the group consisting of imidazoles, arylene polyamines, silanes, and mixtures thereof;
(e) an inert solvent; and
(f) about 0.1% to 1.5% of zinc or aluminum in the form of a salt which is soluble or stably dispersible in said curable composition,
all percentages being by weight and based on the total curable composition excluding solvent.

15. The composition of claim 14 wherein component (a) is a poly(2,6-dimethyl-1,4-phenylene ether) having a number average molecular weight within the range of about 3,000–40,000;
component (b) has the formula:

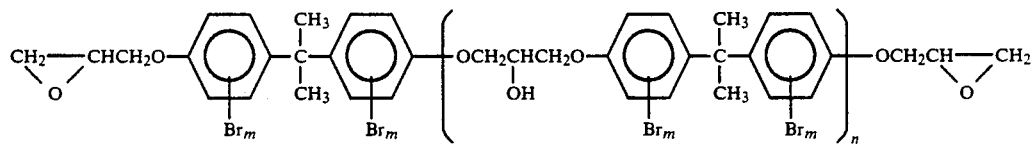

wherein m is 0–4 and n has an average value up to 1.

16. The composition of claim 14 wherein (a) is comprised of a plurality of structural units having the formula:

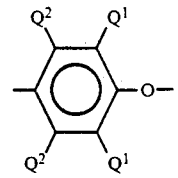

where, each $Q^1$ independently is halogen, a primary or secondary lower alkyl, phenyl, haloalkyl, aminoalkyl, hydroxycarbonoxy, or halohydroxycarbonoxy wherein at least two carbon atoms separate the halogen and oxygen atoms; and each $Q^2$ independently is hydrogen, halogen, a primary or secondary lower alkyl, phenyl, haloalkyl, hydroxycarbonoxy, or halohydroxycarbonoxy as defined for $Q^1$.

17. The composition of claim 14 wherein said catalyst (d) is selected from the group consisting of imidazole, 1-methylimidazole, 1,2-dimethylimidazole, 2-methylimidazole, 2-heptadecylimidazole, 2-ethyl-4-methylimidazole, 2-undecylimidazole, 1-2(-cyanoethyl)-2-phenylimidazole, diethyl toluene diamine, tris(-dimethylaminomethyl)phenol, 3-phenyl-1-1-dimethylurea, 3-(2-aminoethyl)aminopropyl trimethoxysilane, gamma-aminopropyltriethoxysilane, glycidoxypropyltrimethoxysilane, and mixtures thereof.

18. The composition of claim 14 wherein said metal salt of tin (c) is effective in an amount ranging from between about 0.05 and 1.0% by weight of (a) and (b).

19. The composition of claim 14 wherein said metal salt of tin (c) is selected from the group consisting of stannous octoate, di-alkyl tin dicarboxylates, tin mercaptides, stannous acetate, stannic oxide, stannous citrate, stannous oxylate, stannous chloride, stannic chloride, tetra-phenyl tin, tetra-butyl tin, tri-n-butyl tin acetate, di-n-butyl tin dilaurate, dimethyl tin dichloride.

* * * * *